United States Patent [19]
Kanbe et al.

[11] 4,368,385
[45] Jan. 11, 1983

[54] OPTOELECTRONIC SWITCHES

[75] Inventors: Hiroshi Kanbe, Tanashi; Elmer H. Hara, Tokyo, both of Japan

[73] Assignee: Nippon Telegraph & Telephone Public Corp., Tokyo, Japan

[21] Appl. No.: 215,614

[22] Filed: Dec. 12, 1980

[30] Foreign Application Priority Data

Mar. 31, 1980 [JP] Japan .................................. 55-41474
Jun. 18, 1980 [JP] Japan .................................. 55-81316

[51] Int. Cl.³ ............................................. G02B 27/00
[52] U.S. Cl. .................................. 250/551; 250/211 J
[58] Field of Search .................... 250/211 J, 551, 206; 357/19, 29, 30, 16; 455/602, 619

[56] References Cited

U.S. PATENT DOCUMENTS

| | | | |
|---|---|---|---|
| 3,508,126 | 4/1970 | Newman et al. | 250/211 J |
| 3,881,113 | 4/1975 | Rideout et al. | 250/551 |
| 3,979,587 | 9/1976 | De Cremoux | 357/19 |

Primary Examiner—David C. Nelms
Attorney, Agent, or Firm—Thompson, Birch, Gauthier & Samuels

[57] ABSTRACT

In an optoelectronic switch, a photodiode is used as an optical-to-electrical converter in which a first semiconductor including a p-n junction is combined with a second semiconductor having a narrower energy band gap than the first semiconductor to form a heterojunction. When supplied with a light signal modulated by an electrical signal, the photodiode becomes ON or OFF depending upon the magnitude of a reverse bias voltage applied to said photodiode. A source for applying the bias voltage to the photodiode comprises two voltage sources of the same polarity or a single voltage source. The optoelectronic switch, has a high isolation ratio and broad transmission bandwidth, consumes little electrical power and produces low cross-talk levels when used in switching arrays.

20 Claims, 17 Drawing Figures

OPTOELECTRONIC SWITCHES

BACKGROUND OF THE INVENTION

This invention relates to an optoelectronic switch which switches an electrical signal by using light as a medium or carrier, and more particularly an optoelectronic switch utilizing a photodiode.

When compared with other types of switching elements, the optoelectronic switch using light as a carrier is characterized by high isolation corresponding to a large ON-OFF power ratio (~80 dB), broad transmission bandwidth (~3 GHz), the ability to switch analog and digital signals, and small cross-talk when used in switching arrays.

Although optoelectronic switches of various designs have been constructed, they have not yet been developed to a stage where electrical signals ranging from direct current to alternating current in the microwave frequency band can be switched at high speeds.

The following characteristics are required of optoelectronic switches utilized to switch telephone lines, or to distribute television signals, or to switch microwave lines and digital signal lines;

(1) The loss of the signal in the ON state should be as small as possible.

(2) The leakage of the signal in the OFF state should be as small as possible.

(3) High speed switching should be possible.

(4) The power consumption in both the ON and OFF states should be small.

(5) The cross-talk (leakage of signal) between signal transmission lines should be small.

Optoelectronic switches already developed can satisfy some of the requirements described above but cannot satisfy all of the requirements.

A typical optoelectronic switch was disclosed by E. H. Hara, one of the inventors of this application, and R. I. MacDonald in a paper titled "Optoelectronic Broadband Switching Array" in Electronic Letters, Vol. 14, pages 502 and 503, August 1978.

The optoelectronic switch disclosed in this paper comprises a combination of an electrical-to-optical converting element such as a light emitting diode and an optical-electrical converting element such as a p-i-n photodiode.

As is well known in the art, with this type of optoelectronic switch, the degree of optical-to-electrical conversion efficiency and impedance depends on the magnitude and polarity of the bias voltage applied to the photodiode. More particularly, with a forward bias, the conversion efficiency and the impedance of the diode is small, whereas when a reverse bias voltage is applied, the conversion efficiency is enhanced.

Usually, one terminal of the optical-to-electrical converting element is grounded via a resistor and the other terminal is selectively connected to two bias sources of opposite polarities through a transfer switch which may be of mechanical design or of semiconductor design. To render ON the optoelectronic switch, the transfer switch is thrown to a bias voltage which applies a reverse bias voltage to the optical-to-electrical converting element, and to render OFF the switch, the transfer switch is thrown to a bias source which applies forward bias to the converting element. By operating the transfer switch in a manner described above, an output corresponding to the incident light signal provided by the electrical-to-optical converting element is produced at a juncture between the converting element and the resistor in response.

It was found that the switching of the signal by switching the polarity of the bias voltage applied to the optical-to-electrical converting element produces the following problems.

(1) To render OFF the optoelectronic switch by applying the forward bias to the optical-to-electrical converting element, it is necessary to pass a current of the order of several milliampares to several tens of milliampares. For this reason, electric power consumption of the converting element and the resistor amounts to several milliwatts to several tens of milliwatts so that a comparatively large capacity electrical power source is required to operate the optical-to-electrical converting element. In addition, where a plurality of optoelectronic switches are used or where they are assembled into an integrated circuit, a comparatively large quantity of heat is generated and this is not desirable for the converting elements and associated electronic circuitry, because the higher temperature resulting from the heat degrades their performance and shortens their useful life time.

(2) Since it is necessary to switch the polarity of the bias source, not only does the circuit design become complicated but also it is necessary to use separate bias sources having different polarities and this is a disadvantage when design, final product size, and economy of manufacturing are considered.

(3) Since the impedance of the converting element varies greatly depending upon the polarity of the bias voltage (i.e., low in the forward bias condition, high in the reverse bias condition), impedance matching cannot be maintained at the output of the switch in the OFF state.

(4) Since the OFF state of the optoelectronic switch is produced partly by shunting of the load resistor by the junction capacitance of the photodiode in the forward bias, the isolation ratio is frequency dependent and at low frequencies the isolation ratio decreases.

(5) Where a p-n or p-i-n junction type photo-diode is used as an optical-to-electrical converting element, as is well known in the art, when the bias voltage is transferred from forward to reverse direction, the switching speed is limited by the charge storage effect at the junction. In such photodiodes, the switching speed ranges from hundreds of nano seconds to several microseconds, meaning that such photodiodes cannot be used for applications requiring high speed switching. As a solution, for the purpose of decreasing the charge storage effect, it has been proposed to diffuse gold into a silicon photodiode. This method, however, not only makes it difficult to manufacture the photodiode but also decreases its optical-to-electrical conversion efficiency. In addition, this method cannot obviate the above described disadvantages (1), (2) and (3).

Because of these disadvantages, the field of application of the prior art optoelectronic switches has been limited to circuit switching where switching speed is not a point of concern.

SUMMARY OF THE INVENTION

Accordingly, it is the principal object of this invention to provide an improved optoelectronic switch.

Another object of this invention is to provide an optoelectronic switch having lower power consumption than those in the prior art. Still another object of this invention is to provide an optoelectronic switch but can operate at high switching speeds.

At another object of this invention is to provide a novel optoelectronic switch that can simplify peripheral electronic circuitry and be assembled readily into an integrated circuit.

Yet another object of this invention is to provide an improved optoelectronic switch capable of stable operation over a long period.

A further object of this invention is to provide an optoelectronic switch that allows ready impedance matching with a device that is connected to the switch.

According to this invention these and further objects can be accomplished by providing an optoelectronic switch comprising an electrical-to-optical converting means for producing a light signal modulated by an electric signal to be switched, an optical-to-electrical converting means disposed to receive the light signal emitted by the electrical-to-optical converting means and bias source means for applying a reverse bias to the optical-to-electrical converting means to render ON and OFF the same. The optical-to-electrical converting means is constituted of a photodiode having a first semiconductor containing a p-n junction and a second semiconductor with a narrower energy band gap than the first semiconductor to form a heterojunction between the two semiconductors.

The photodiode may be an avalanche diode. The first semiconductor is made of a III–V compound semiconductor or Si, while the second semiconductor device is made of a III–V compound semiconductor or Ge.

DESCRIPTION OF THE PREFERRED EMBODIMENTS

Figure 1:
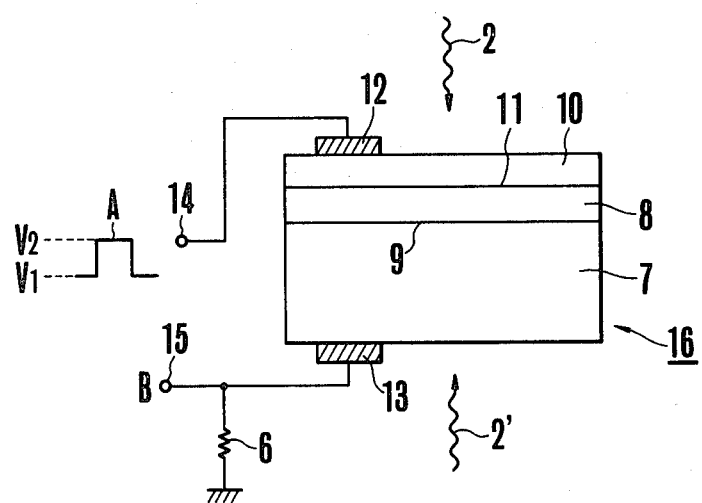
FIG. 1 is a sectional view showing one example of a photodiode element utilized as an optoelectronic switch embodying the invention.

A photodiode embodying the invention shown in FIG. 1 comprises a semiconductor 7 of one conductivity type and the same or different kind semiconductor 8 of the opposite conductivity type overlying the semiconductor 7 to form a p-n junction therebetween. These semiconductors constitute the first semiconductor. On the semiconductor 8 is provided a second semiconductor 10 having the same conductivity type as the semiconductor 8 but a narrower energy band gap than that of the semiconductor 8. The interface between semiconductors 8 and 10 forms a heterojunction 11. Electrodes 12 and 13 are disposed to the surfaces of the semiconductors 10 and 7 respectively to enable electrical connection. Incident light is irradiated on either or both surfaces of semiconductor 10 and 7 as shown by reference numeral 2 and 2' in FIG. 1. Irrespective of the direction of the incident light, substantially the same effect can be obtained.

In order to use the photodiode in an optoelectronic switch, a voltage A varying between V1 and V2 is applied to terminal 14 connected to the electrode 12. In this case, voltage V1 is selected such that it would be 0 V or act as a reverse bias voltage lower than a predetermined value with reference to the photodiode 16, while voltage V2 is selected such that it would act as a reverse bias voltage higher than a predetermined value with reference to the photodiode 16. The wavelength of the incident light 2 or 2' is selected such that the light energy would not be absorbed by the semiconductor 8 having a wide energy band gap but would be absorbed by the semiconductor 10 having a narrow energy band gap.

As is well known in the art, in a reversely biased diode a depletion layer spreads from the p-n junction over a width corresponding to the bias voltage. The voltage V1 is set to a sufficiently low voltage, as described above including 0 V, so as to prevent the depletion layer from reaching the hetero-junction 11, while the voltage V2 is set to a sufficiently high voltage so as to permit the depletion layer to reach the heterojunction or extend into semiconductor 10. When the voltages V1 and V2 are selected as described above, an output signal B does not appear at the output terminal 15 while voltage V1 is being applied. The output signal B can be obtained only when voltage V2 is impressed. In other words, it is possible to switch ON and OFF the output signal B corresponding to an incident optical signal, in accordance with the magnitude of the impressed bias voltage.

Figure 2:
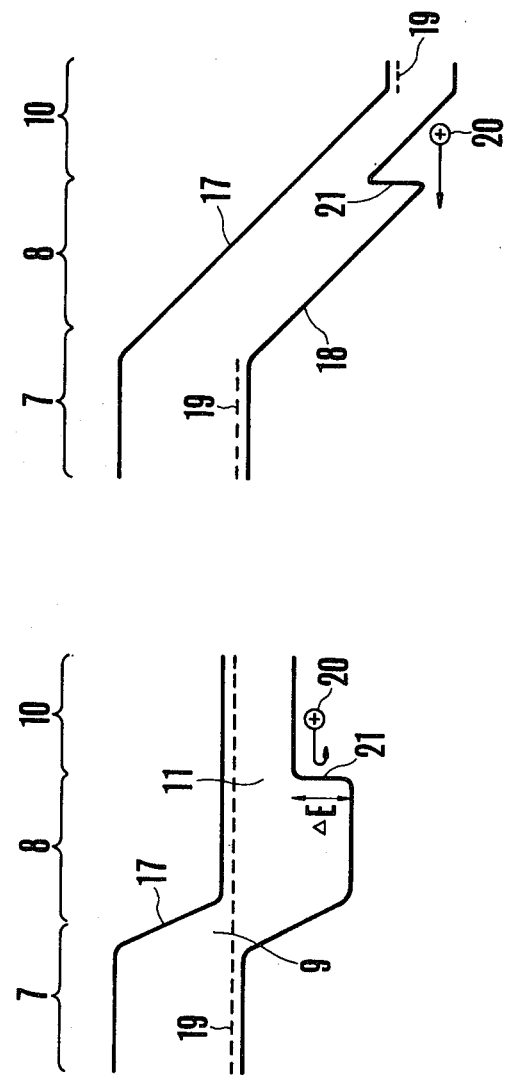
FIGS. 2A and 2B are graphs showing an energy band structure useful to explain the operation of the photodiode shown in FIG. 1.

The principle of operation of the photodiode 16 described above will now be described in detail. The energy band structure of the photodiode 16 shown in FIG. 1 is shown in FIG. 2A in which reference numeral 17 designates the conduction band edge, 18 designates the valence band edge, and 19 the Fermi level. The p-n junction 9 is formed between semiconductors 7 and 8, while the heterojunction 11 is formed between semiconductors 8 and 10. The energy band structure shown in FIG. 2A is depicted on the assumption that the semiconductor 7 is of the p-type, while the semiconductors 8 and 10 are of the n-type. From the following description it will be noted that the conductivity types p and n may be reversed, in which case the terms holes and electrons should be interchanged.

When light having such a wavelength that the light energy is not absorbed by the semiconductor 8 but absorbed by semiconductor 10, is irradiated upon photodiode 16, the light energy is absorbed only by semiconductor 10 thus creating holes 20. When the applied bias voltage V1 is sufficiently low, the depletion layer in semiconductor 8 does not reach the hetero-junction 11 so that the holes 20 cannot penetrate through the energy barrier 21 formed at the heterojunction 11, meaning that the incident light causes no current to flow from electrode 12 to electrode 13. In other words, even when light is irradiated onto photodiode 16, the switch is in the OFF state.

When the bias voltage is increased so as to cause the depletion layer to expand and reach the heterojunction 11, the energy band structure becomes as shown in FIG. 2B so that the holes 20 can flow over the energy barrier 21 into semiconductor 8. Consequently, it is possible to obtain an output current having a magnitude corresponding to the incident light signal, thus turning the switch ON.

A specific example of the invention described below. The first semiconductor containing a p-n junction 9 (i.e. semiconductors 7 and 8) can be the compound semiconductor InP and the second semiconductor 10 can be a III-V compound semiconductor, such as $In_xGa_{1-x}As_{1-y}P_y$ where x=0.53 and y=0 (i.e., $In_{0.53}Ga_{0.47}As$, hereafter abbreviated as InGaAs).

Figure 3:
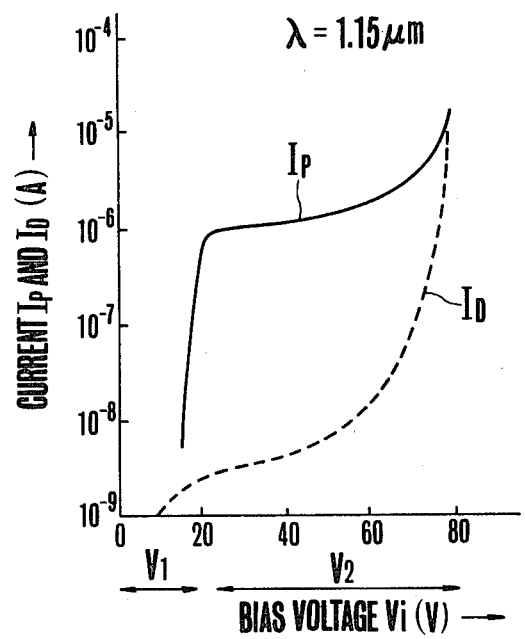
FIG. 3 shows current-voltage characteristics of the photodiode shown in FIG. 1.

The measurement results for an experimentally fabricated photodiode 16 is shown by a graph in FIG. 3 in which the abscissa represents the reverse bias voltage Vi and the ordinate the photocurrent $I_p$ and dark current $I_D$. In this case, the incident light had a wavelength of $\lambda=1.15$ micrometers. This photodiode was prepared by continuous liquid phase epitaxial growth technique. The thickness of the p+-type InP which corresponds to semiconductor 7 is 200 micrometers, the carrier concentration is about $10^{18}$ cm$^{-3}$. The thickness of the n-type InP (semiconductor 8) and n-type InGaAs (semiconductor 10) are both 2 micrometers and the carrier concentrations for both are $10^{16}$ cm$^{-3}$. As shown in FIG. 3, when a bias voltage Vi=V1 ranging from 0 V to about 15 V is applied, no photocurrent $I_p$ flows, and the current flowing through the photodiode comprises only the dark current $I_D$. More particularly, the photodiode is in an OFF state and does not respond to the incident light. On the other hand, with the bias voltage Vi=V2 ranging from 20 to 80 V, photocurrent $I_p$ flows as shown in FIG. 3, thus the photodiode is turned ON state and responds to the incident light.

Although the foregoing description concerns only the switching operation, the optoelectronic switch can also be used as a variable attenuator having a signal directivity because when the reverse bias voltage is varied continuously, the magnitude of the output signal also varies continuously as shown in FIG. 3.

It can be clearly understood from the foregoing descriptions that the photodiode states of ON and OFF depends on whether the depletion layer reaches the heterojunction 11 or not. In other words, the ON and OFF states depend on whether the holes 20 created by light overcome the energy barrier 21 or not. Thus, the bias voltage V1 necessary to turn the switch OFF is a low reverse voltage, including 0 V, which does not allow the depletion layer to reach the heterojunction 11. On the other hand, the bias voltage V2 necessary to turn the switch ON is a reverse voltage sufficient to permit the depletion layer to reach the heterojunction 11. In other words, the switching operation can be controlled by a voltage including 0 V which places the photodiode in a reverse bias state or a zero bias state. In contrast to prior art optoelectronic switches, no forward biasing is required for the operation of the switch.

In order to provide a physical basis for the determination of the design for the photodiode structure, the relation between composition of the semiconductors and the bias voltages V1 and V2 are explained below.

Figure 4:
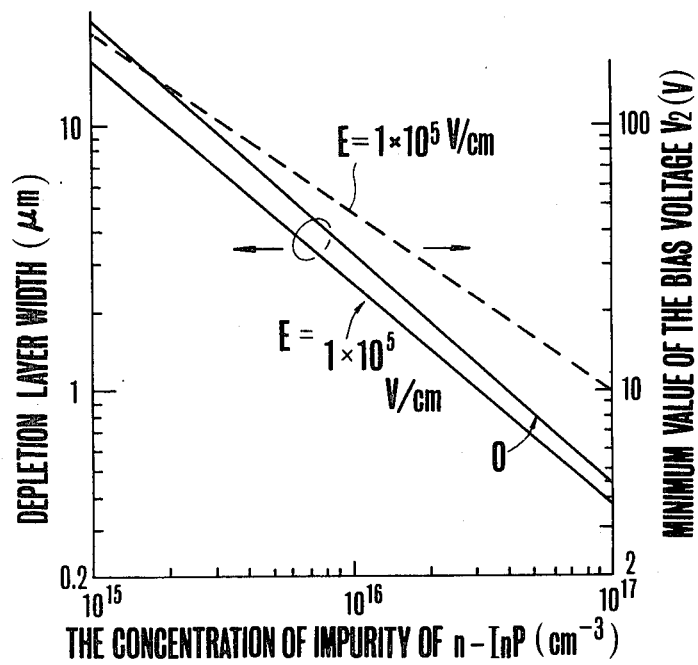
FIG. 4 is a graph showing the relation between the n-InP impurity concentration and the depletion layer width of the photodiode shown in FIG. 1.

FIG. 4 is a graph showing the relation between the impurity concentration in the n-type InP semiconductor and the depletion layer width when the photodiode is biased near the avalanche breakdown voltage. The quantity E represents the strength of the electric field at the heterojunction. For example, if the electric field E is zero and the impurity concentration of n-InP shown by the abscissa is $1 \times 10^{16}$ cm$^{-3}$, the lefthand ordinate shows that the depletion layer width is 3.3 micrometers.

In order to allow the depletion layer to cross the heterojunction and turn the switch ON, a location where the magnitude of E is approximately $1 \times 10^5$ V/cm is desireable. This value is chosen with due regard to an increase in the dark current if larger values for E are chosen. Then, for the given impurity concentration of $1 \times 10^{16}$ cm$^{-3}$, the depletion layer thickness is 2.5 micrometers. The ordinate on the righthand side of FIG. 4 shows a minimum value of the bias voltage V2 necessary to turn the switch ON. If an n-type InP layer of 2.5 micrometer thickness is thus chosen, the minimum voltage to turn the switch ON (V2) is 47 V according to FIG. 4. Therefore, by setting the bias voltages V1 and V2 as follows, it is possible to turn the photodiode OFF and ON;

$$0 \leq V1 < 47(V), \quad 47(V) < V2.$$

Isolation ratio (ON-OFF power ratio) $I_r$ is determined by the magnitude $\Delta E$ of energy barrier (c.f., FIGS. 2A and 2B) formed at the heterojunction 11. Its value is given approximately by the expression $$I_r = \exp(-\Delta E/kT)$$

where k represents Boltmann's constant and T an absolute temperature. The energy barrier E corresponds to the difference under a first order approximation between the energy band gap of the two semiconductors that form the heterojunction. When InP and $In_{0.53}Ga_{0.47}As$ are used as the semiconductors, we have $$\Delta E = 0.53 eV.$$

As is well known in the art, in the case of $In_xGa_{1-x}As_{1-y}P_y$ the energy band gap can be varied by varying the values of x and y, thereby varying the energy barrier $\Delta E$.

Figure 5:
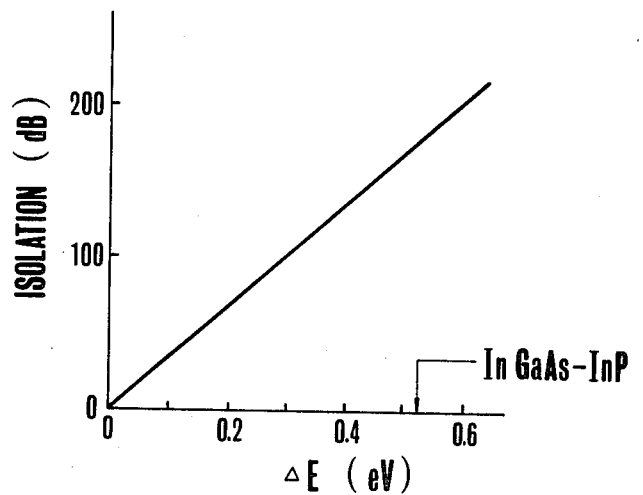
FIG. 5 is a graph showing the relation between the energy barrier $\Delta E$ and the isolation ratio in dB.

FIG. 5 is a graph showing the relation between the energy barrier $\Delta E$ and isolation ratio $I_r$. From this figure it is possible to determine the required composition of InGaAsP for a desired value of isolation ratio.

A preferred embodiment of the optoelectronic switch of this invention utilizing the photodiode 16 described above is shown in FIG. 6 and comprises a light emitting diode or a semiconductor laser 22 supplied with a bias voltage 23 through bias circuit 24 and a signal S to be switched thereby emitting a modulated light signal 2. These elements constitute a light source 30. The light signal 2 produced by the light source 30 is received by the photodiode 16 which is selectively applied with reverse voltage V2 or V1 from the sources 4 and 4' through the transfer switch 5 operated by an external control signal. As mentioned previously V1 includes the 0 V condition as well. The cathode electrode of the photodiode 16 is grounded through a resistor 6 and an output is derived out from the juncture between the photodiode 16 and the resistor 6 and sent to a signal processing circuitry 25. The bias voltage circuit shown in this embodiment and comprising the bias voltage sources 4 and 4', and the transfer switch 5 may be in the form of one of the mechanical, electromechanical switches and electronic circuits, including semiconductor circuits, as is well known to those familiar with the art. In this case, the another electrode of the photodiode 16 is connected to the electronic circuit. The electronic circuits mentioned above include pulse-type circuits which apply the voltages V1 and V2 for a specific length of time.

A modified embodiment of the optoelectronic switch of this invention utilizing the photodiode 16 described above is shown in FIG. 7. As has been described before, the magnitude of the bias voltage applied to the photodiode 16 for turning OFF the optoelectronic switch can be zero. For this reason, to render OFF the switch, the applied bias may be cut off by open circuiting the transfer switch 5 as shown in FIG. 7. Thus, this circuit is equivalent to that shown in FIG. 6 except the operation of the trasnfer switch 5.

Figure 6:
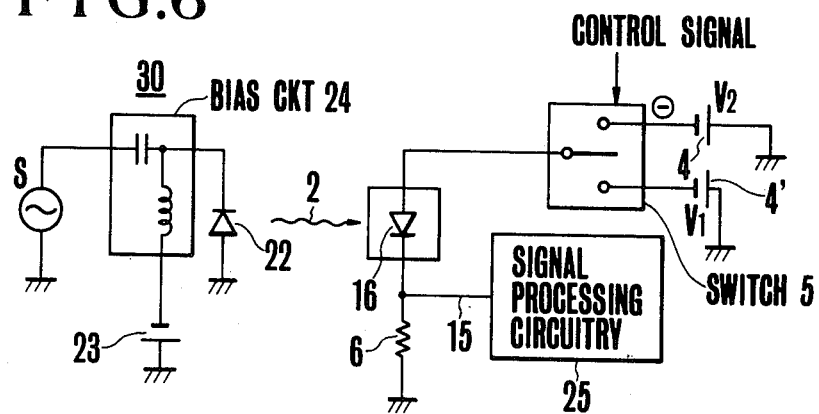
FIG. 6 is a connection diagram showing one embodiment of the optoelectronic switch according to this invention utilizing the switch shown in FIG. 1.
Figure 7:
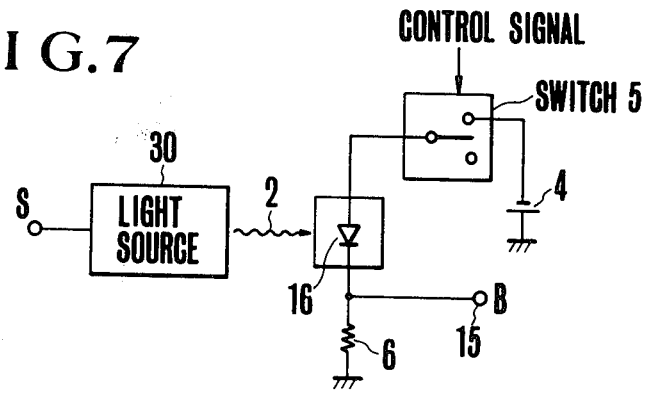
FIG. 7 is a connection diagram showing a modified embodiment of the optoelectronic switch according to this invention.

It should be noted that the connection of photodiode 16 may be reversed in FIGS. 6 and 7 so that the anode is connected to resistor 6. In such a configuration, the polarities of the bias voltage sources 4 and 4' should also be reversed to maintain the supply of a reverse bias including a 0 V bias to the photodiode 16.

Figure 8:
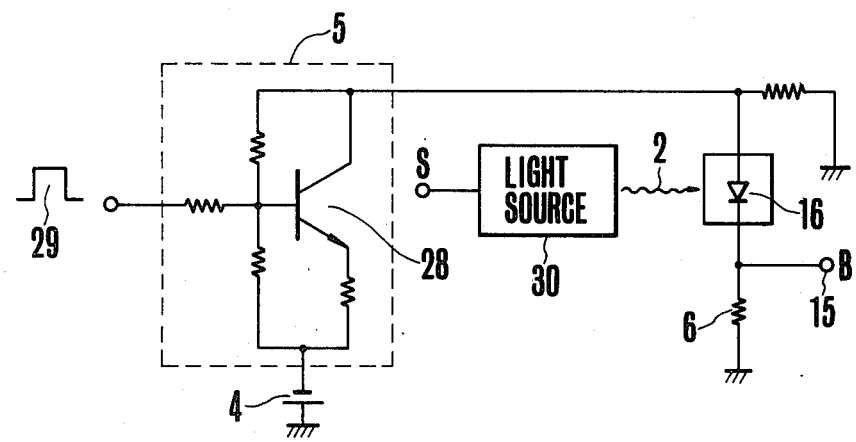
FIGS. 8 and 9 are connection diagrams showing show modified embodiments of the optoelectronic switches.

FIG. 8 shows the detail of the optoelectronic switch including the transfer switch circuit 5. In this case, for the purpose of turning OFF the photodiode 16, the bias voltage is cut off by a transistor 28 and for the purpose of turning ON the transistor 28 is made conductive by a gating pulse 29 so as to apply a reverse bias voltage to the photodiode 16.

Figure 9:
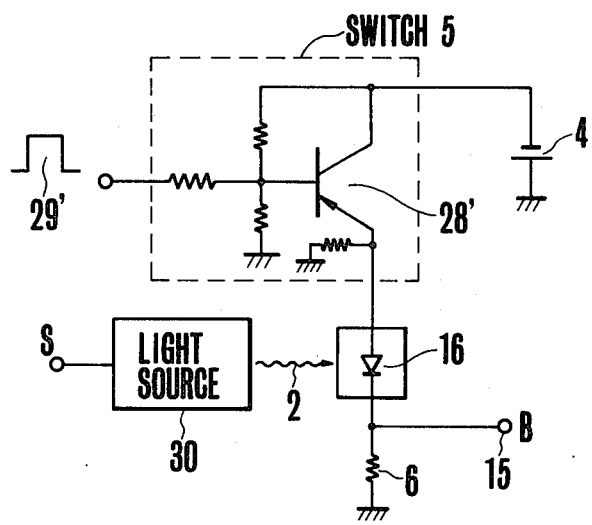

FIG. 9 corresponds to FIG. 7 in which for the purpose of turning ON the photodiode 16, a transistor 28' is turned ON by a gating pulse 29' to increase the bias voltage so as to apply a reverse bias voltage to photodiode 16. For the purpose of turning OFF the photodiode, the transistor 28' is turned OFF.

As described above with the optoelectronic switches shown in FIGS. 6 to 9, as it is not necessary to apply a forward bias voltage to the photodiode, the power consumption of the photodiode during the OFF state of the photodiode 16 is negligibly small. For this reason, as it is possible to use a bias source of a single polarity, the circuit construction becomes simple. Moreover, as it is not necessary to transfer the bias voltage for the photodiode between forward and reverse directions, it is possible to effect high speed switching because the charge storage effect under forward biasing does not enter into the picture. The switching time is determined primarily by the junction capacitance of photodiode 16 which is approximately 4 pF at zero bias and switching times shorter than 10 nanoseconds should be possible.

In order to reduce the junction capacitance and thereby shorten the switching time, the OFF state reverse bias voltage V1 may be raised optionally to a magnitude just below that where the depletion layer penetrates the heterojunction 11 in photodiode 16. In doing so the OFF state is still maintained, but the isolation ratio is somewhat reduced because the energy barrier 21 in photodiode 16 is reduced and permits some holes 20 to flow over the barrier. The magnitude of V1 is therefore selected with a view to maintain a desired minimum level of isolation ratio while shortening the switching time as much as possible. The magnitude of V1 can be set by adjusting the circuit component values and circuit configuration of the bias circuit 5 by means well known to those familiar with the art of electronic circuitry.

Figure 10:
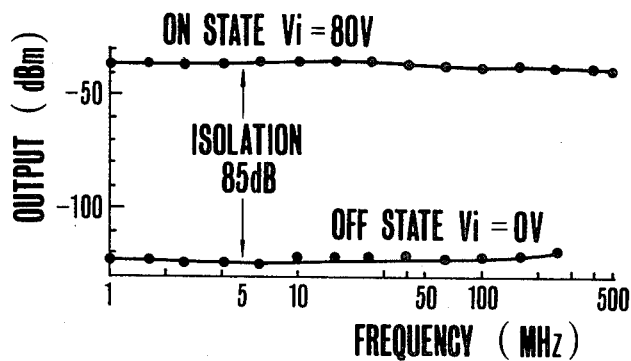
FIGS. 10 to 12 are graphs showing data of experimental result of the optoelectronic switch embodying the invention.
Figure 11:
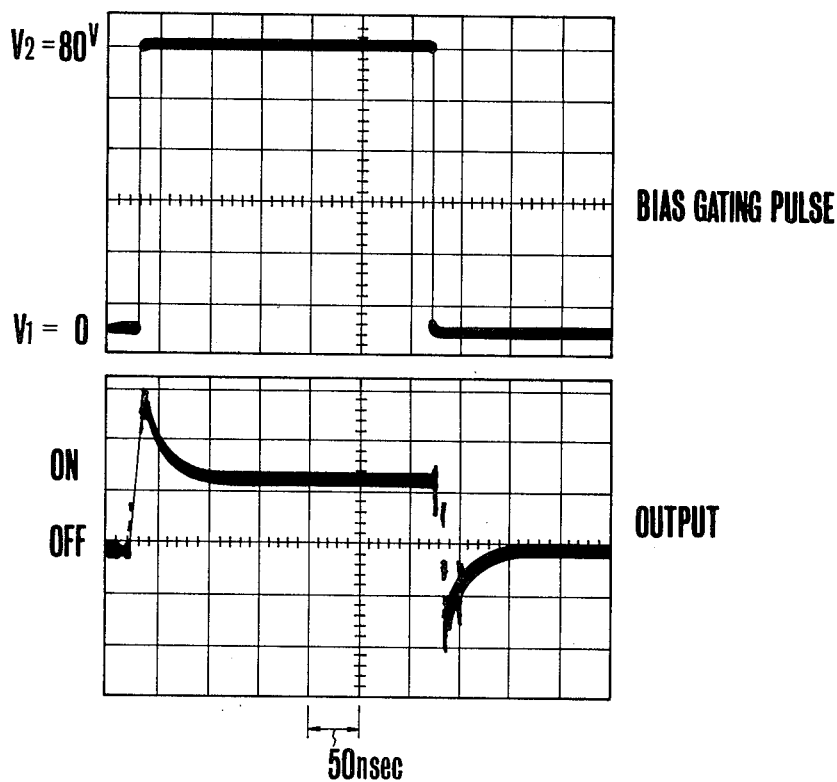
Figure 12:
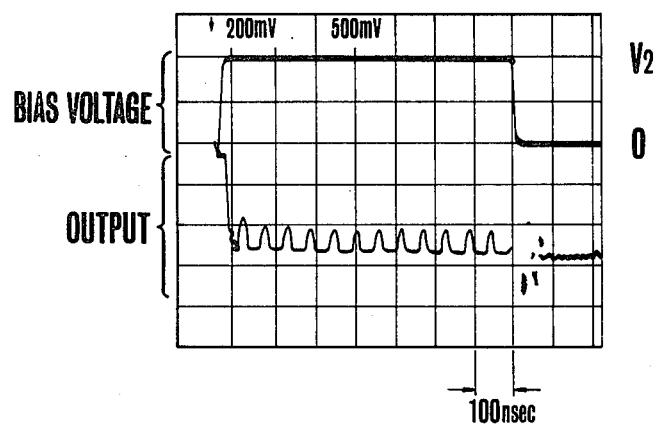

FIGS. 10 to 12 show experimental results obtained from some photodiodes. FIG. 10 shows the relationship between the isolation ratio and the frequency of signal S measured with reference to the embodiment shown in FIG. 6. A spectrum analyzer, which corresponds to the signal processing circuitry 25, was used for the measurement.

The photodiode employed was made of indium phosphide InP and indium gallium arsenide $In_{0.53}Ga_{0.47}As$. The results shown in FIG. 10 show that an isolation ratio of higher than 80 dB was obtained for frequencies up to and above 250 MHz.

FIG. 11 shows a result of measurement regarding the variation with time of the switching operation where the bias voltage applied to the photodiode was changed from 0 V to V2 and no modulation was applied to the incident light. The upper waveform shows the bias gating signal that was applied, while the lower waveform shows the output. The results show that switching transients caused by the gating signal settle in approximately 50 nanoseconds.

FIG. 12 shows the result of gating an 18 M bit/s digital pulse signal which acted as the electric signal S. The results shown in FIGS. 11 and 12 were obtained by using an oscilloscope which corresponds to the signal processing circuitry 25.

To those familar with the art of electronic circuitry, it is clear that switching speed faster than 10 nanoseconds can be achieved.

Figure 13A:
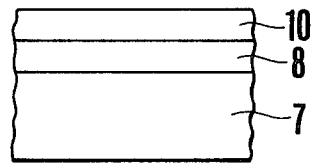
FIGS. 13A, 13B, 13C and 13D illustrate one example of the steps of manufacturing the photodiode utilized in the optoelectronic switch according to this invention.
Figure 13C:
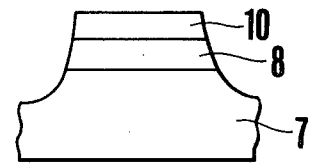
Figure 13B:
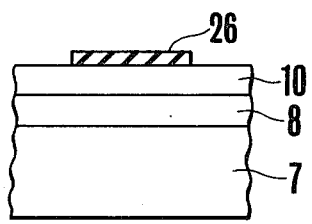

A method of manufacturing a photodiode of this invention will now be described with reference to FIGS. 13A to 13D. FIG. 13A shows a sectional view of a semiconductor which was obtained by sequentially growing a layer 8 of n—InP and a layer 10 of InGaAs on a substrate 7 of p+—InP by the well known liquid phase epitaxial technique. The thicknessess of n-InP and n-InGaAs are 2.5 microns and 2.0 microns respectively and the n type impurity concentrations of these layers are $1 \times 10^{16}$ cm$^{-3}$. As has already been pointed out, the relationship between the chosen thickness and the impurity concentration for the n-InP layer can be obtained from FIG. 4. Next, a photosensitive resist film is applied to the surface of layer 10 of n-InGaAs by a method to those familiar with the art. Then, the photosensitive resist film is exposed to ultra violet light through a suitable mask and then developed to partially leave the photosensitive resist 26 as shown in FIG. 13B. An etchant comprising a well known mixture of $H_2O$, $H_2SO_4$ and $H_2O_2$ is used to etch away part of layer 10 consisting of n-InGaAs, while an etchant comprising a well known mixture of bromine and methylalcohol is used to etch away part of layer 8 consisting of n—InP and substrate 7 consisting of p+—InP. Then the resist film on the layer 10 of n-InGaAs is removed to obtain a mesa construction having a cross-sectional configuration as shown in FIG. 13C. The mesa construction has a diameter of approximately 140 microns.

Figure 13D:
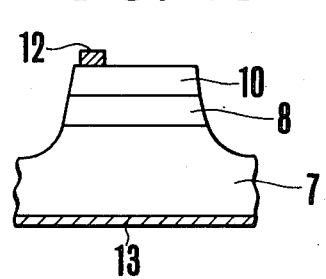

Finally, an alloy of Au-Zn is vapor-deposited on the substrate 7 of p+—InP and an alloy of Au-Ge-Ni is vapor-deposited on the layer 10 of n-InGaAs. Thereafter, the assembly is subjected to an alloying treatment at a temperature of about 400° C. for approximately 5 minutes to form electrodes 12 and 13. FIG. 13D shows the cross-section of the completed photodiode.

Although a mesa type photodiode was described it is easy to construct it as a planar structure, as is well known to those familiar with the art. Such a structure may have a so-called cap layer to improve the optical-to-electrical conversion efficiency, i.e. a semiconductor layer having a large energy band gap. It should also be understood that the method of crystal growth is not limited to the liquid phase epitaxial growth method and that vapor phase epitaxial method or a molecular beam epitaxial method can be used as well. It is only necessary that the first and second semiconductors are formed with their relative magnitude of the energy band gaps satisfying the conditions shown in FIGS. 2A and 2B.

For the sake of simplicity, an optoelectronic switch utilizing a photodiode consisting of InP and InGaAs was described, but it will be clear that various combinations of semiconductors other than those mentioned are possible. Modification to the invention are therefore listed below.

A. The first semiconductor forming a p-n junction is made of Si and the second semiconductor having a smaller energy band gap than the first semiconductor and forming a heterojunction with said semiconductor is selected from the following group of semiconductors consisting of Ge, $In_xGa_{1-x}As_{1-y}P_y$, $Al_xGa_{1-x}As_{1-y}Sb_y$, $In_xGa_{1-x}As_{1-y}Sb_y$, and $(Al_xGa_{1-x})_yIn_{1-y}Sb$ where $0 \leq x \leq 1$ and $0 \leq y \leq 1$.

B. The first semiconductor forming a p-n junction is made of one of $Al_xGa_{1-x}As_{1-y}Sb_y$, $In_xGa_{1-x}As_{1-y}Sb_y$, $In_xGa_{1-x}As_{1-y}P_y$ and $(Al_xGa_{1-x})_yIn_{1-y}Sb$, while the second semiconductor having a smaller energy band gap than the first semiconductor and forming a heterojunction with said semiconductor is made of one of $Al_{x'}Ga_{1-x'}As_{1-y'}Sb_{y'}$, $In_{x'}Ga_{1-x'}As_{1-y'}Sb_{y'}$, $In_{x'}Ga_{1-x'}As_{1-y'}P_{y'}$ and $(Al_{x'}Ga_{1-x'})_{y'}In_{1-y'}Sb$, where $0 \leq x \leq 1$, $0 \leq y \leq 1$, $0 \leq x' \leq 1$ and $0 \leq y' \leq 1$.

C. Similarly, the first semiconductor is made of AlP or GaP and the second semiconductor is made of Si, because lattice matching can be made readily and the manufacturing of the element is facillitated. When such a photodiode is used for an optoelectronic switch a large isolation ratio can be obtained because of the large energy band gap difference.

D. Similarily, the first semiconductor is made of AlAs or GaAs and the second semiconductor device is made of Ge which makes good lattice matching with the material of the first semiconductor, and therefore it is possible to readily manufacture the photodiode.

E. Similarly, the first semiconductor is made of $Al_xGa_{1-x}As_{1-y}Sb_y$ and the second semiconductor is made of $Al_{x'}Ga_{1-x'}As_{1-y'}Sb_{y'}$ having substantially the same lattice constant as the first semiconductor but a smaller energy band gap. Especially, where the second semiconductor device is made of $Al_{x'}Ga_{1-x'}Sb$ (i.e. $y'=1$), or GaSb (i.e. $x'=0$, $y'=1$) or InAs, crystal growth is facillitated.

Where the photodiode has an avalanche multiplication characteristic, the isolation ratio and signal to noise ratio can be improved, thus providing more desirable switching characteristic, as is well known in the art.

As described above, according to the optoelectronic switch of this invention, it is possible to switch an electric signal at a high speed with a large isolation ratio by varying the magnitude of the reverse bias voltage impressed upon the photodiode. As described above, the result of a preliminary experiment shows that it is possible to switch a high frequency signal of higher than 500 MHz at a switching time of 50 nanoseconds and that isolation ratio of the signal between OFF and ON states is higher than 80 dB. Considering the modulation characteristic of the light source and the high frequency characteristic of the photodiode, it is possible to switch electrical signals ranging from DC to high frequency signals higher than 1 GHz. Moreover, since the switching speed is determined primarily by the junction capacitance of the photodiode it is can be readily seen that the switching time can be reduced to less than 10 nano seconds. It is also possible to switch high speed digital signals, because of the broad baseband transmission bandwidth (>500 MHz).

As described above, according to this invention there is provided a photodiode having low poor consumption and simple associated circuit configuration which can switch at high speeds and operate always as a high impedance circuit element because it is always under reverse bias or 0 V bias. Then, it is possible to construct an optoelectronic switch capable of readily providing impedance matching and having a high signal isolation ratio comparable or better than that provided by the prior art.

Accordingly, the optoelectronic switch of this invention can be used for various applications which can not be realized with the prior art optoelectronic switch. More particularly, the low power consumption makes it possible to use the optoelectronic switch and fabricate a switching array such as that proposed by E. H. Hara and R. I. MacDonald as an integrated circuit of high density with the result that even a complicated switch construction, the size thereof can be minimized, thus improving economy and reliability.

It is to be noted that since high speed operation of the order of a nanosecond is possible, the optoelectronic switch can be used for high speed switching of microwave lines, switching IF signals of millimeter waves, switching of digital lines, telephone exchange, switching of signals of a time division multiplex access (TDMA) system utilized in a satelite communication circuit, and switching microwave signals with different phases utilized in phased array radars.

What is claimed is:
1. An optoelectronic switch comprising:
light source means for producing a light signal modulated by an electric signal to be switched;
optical-to-electrical converting means disposed to receive the light signal emitted by said light source means, and
bias source means for applying reverse bias to said optical-to-electrical converting means to render ON and OFF the same;
said optical-to-electrical converting means being constituted by a photodiode formed by a first semiconductor having therein a p-n junction and a second semiconductor having a smaller energy band gap than said first semiconductor, and combined therewith to form a heterojunction.

2. The optoelectronic switch according to claim 1 wherein said bias source means comprises at least one bias source, and control means interposed between said bias source and said optical-to-electrical converting means for applying a reverse or zero bias voltage to said optical-to-electrical converting means to turn ON or OFF the said switch.

3. The optoelectronic switch according to claim 2 wherein said bias source is made up of two sources having different voltages and said control means performs first and second control operations, said first control operation connecting one of the sources which applies a shallow reverse bias voltage to said optical-to-electrical converting means to render OFF said switch, and said second control operation connecting the other source which applies a deeper reverse bias to said optical-to-electrical converting means to render ON said switch.

4. The optoelectronic switch according to claim 3 wherein said one source applying said shallow reverse bias produces zero volts.

5. The optoelectronic switch according to claim 2 wherein said bias source means comprises a voltage source giving a single bias voltage, and said control means performs first and second control operations, said first control operation connecting said voltage source to said optical-to-electrical converting means to render ON the same, and said second control operation disconnecting said voltage source from said optical-to-electrical to render OFF the same.

6. The optoelectronic switch according to claim 1 or 2 wherein said optical-to-electrical converting means is constituted by a photodiode comprising a first semiconductor having a p-n junction and made of a semiconductor selected from the group consisting of III–V compound semiconductors or Si, and a second semiconductor made of a semiconductor selected from the group consisting of III–V compound semiconductors or Ge having a lattice constant substantially coinciding with that of said first semiconductor and an energy band gap narrower than that of said first semiconductor.

7. The optoelectronic switch according to claim 1 or 2 wherein said optical-to-electrical converting means is constituted by a photodiode comprising a first semiconductor having a p-n junction and made of InP, and a second semiconductor made of $In_xGa_{1-x}As_{1-y}P_y$, where $0 \leq x \leq 1$ and $0 \leq y \leq 1$, having a lattice constant substantially coinciding with that of said first semiconductor and an energy band gap narrower than that of said first semiconductor.

8. The optoelectronic switch according to claim 1 or 2 wherein said optical-to-electrical converting means is constituted by a photodiode comprising a first semiconductor having a p-n junction and made of GaAs, and a second semiconductor device made of $Al_xGa_{1-x}As_{1-y}Sb_y$, where $0 \leq x \leq 1$ and $0 \leq y \leq 1$, having a lattice constant substantially coinciding with that of said first semiconductor and an energy band gap narrower than that of said first semiconductor.

9. The optoelectronic switch according to claim 1 or 2 wherein said optical-to-electrical converting means is constituted by a photodiode comprising a first semiconductor having a p-n junction and made of $Al_{1-x}Ga_xAs_ySb_{1-y}$ where $0 \leq x \leq 1$ and $0 \leq y \leq 1$, and a second semiconductor made of $Al_{1-x'}Ga_{x'}As_{y'}P_{1-y'}$, where $0 \leq x' \leq 1$ and $0 \leq y' \leq 1$, having a lattice constant substantially coinciding with that of said first semiconductor and an energy band gap narrower than that of said first semiconductor.

10. The optoelectronic switch according to claim 1 or 2 wherein said optical-to-electrical converting means is constituted by a photodiode comprising a first semiconductor having a p-n junction and made of $In_{1-x}Ga_xAs_ySb_{1-y}$ where $0 \leq x \leq 1$ and $0 \leq y \leq 1$, and a second semiconductor made of $Al_{1-x'}Ga_{x'}As_{y'}Sb_{1-y'}$, where $0 \leq x' \leq 1$, $0 \leq y' \leq 1$, having a lattice constant substantially coinciding with that of said first semiconductor and an energy band gap narrower than that of said first semiconductor.

11. The optoelectronic switch according to claim 1 or 2 wherein said optical-to-electrical converting means is constituted by a photodiode comprising a first semiconductor having a p-n junction and made of $In_{1-x}Ga_xAs_ySb_{1-y}$, where $0 \leq x \leq 1$ and $0 \leq y \leq 1$, and a second semiconductor device made of $Al_{1-x'}Ga_{x'}As_{y'}P_{1-y'}$ where $0 \leq x' \leq 1$ and $0 \leq y' \leq 1$, having a lattice constant substantially coinciding with that of said first semiconductor and an energy band gap narrower than that of said first semiconductor.

12. The optoelectronic switch according to claim 1 or 2 wherein said optical-to-electrical converting means is constituted by a photodiode comprising a first semiconductor having a p-n junction and made of $In_{1-x}Ga_xAs_yP_{1-y}$ where $0 \leq x \leq 1$ and $0 \leq y \leq 1$, and a second semiconductor device made of $Al_{1-x'}Ga_{x'}As_{y'}Sb_{1-y'}$, where $0 \leq x' \leq 1$ and $0 \leq y' \leq 1$, having a lattice constant substantially coinciding with that of said first semiconductor and an energy band gap narrower than that of said first semiconductor.

13. The optoelectronic switch according to claim 1 or 2 wherein said optical-to-electrical converting means is constituted by a photodiode comprising a first semiconductor having a p-n junction and made of $In_{1-x}Ga_xAs_yP_{1-y}$ where $0 \leq x \leq 1$ and $0 \leq y \leq 1$, and a second semiconductor made of $Al_{1-x'}Ga_{x'}As_{y'}P_{1-y'}$, where $0 \leq x' \leq 1$ and $0 \leq y' \leq 1$, having a lattice constant substantially coinciding with that of said first semiconductor and an energy band gap narrower than that of said first semiconductor.

14. The optoelectronic switch according to claim 1 or 2 wherein said optical-to-electrical converting means is constituted by a photodiode comprising a first semiconductor having a p-n junction and made of $(Al_xGa_{1-x})_yIn_{1-y}Sb$ where $0 \leq x \leq 1$ and $0 \leq y \leq 1$, and a second semiconductor made of $(Al_{x'}Ga_{1-x'})_{y'}In_{1-y'}Sb$, where $0 \leq x' \leq 1$ and $0 \leq y' \leq 1$, having a lattice constant substantially coinciding with that of said first semiconductor and an energy band gap narrower than that of said first semiconductor.

15. The optoelectronic switch according to claim 1 or 2 wherein said optical-to-electrical converting means is constituted by a photodiode comprising a first semiconductor having a p-n junction and made of $In_{1-x}Ga_xAs_ySb_{1-y}$ where $0 \leq x \leq 1$ and $0 \leq y \leq 1$, and a second semiconductor device made of $(Al_{x'}Ga_{1-x'})_{y'}In_{1-y'}Sb$, where $0 \leq x' \leq 1$ and $0 \leq y' \leq 1$, having a lattice constant substantially coinciding with that of said first semiconductor and an energy band gap narrower than that of said first semiconductor.

16. The optoelectronic switch according to claim 1 or 2 wherein said optical-to-electrical converting means is constituted by a photodiode comprising a first semiconductor having a p-n junction and made of $In_{1-x}Ga_xAs_yP_{1-y}$ where $0 \leq x \leq 1$ and $0 \leq y \leq 1$, and a second semiconductor device made of $In_{1-x'}Ga_{x'}As_{y'}P_{1-y'}$, where $0 \leq x' \leq 1$ and $0 \leq y' \leq 1$, having a lattice constant substantially coinciding with that of said first semiconductor and an energy band gap narrower than that of said first semiconductor.

17. The optoelectronic switch according to claim 1 or 2 wherein said optical-to-electrical converting means is constituted by a photodiode comprising a first semiconductor having a p-n junction and made of a semiconductor selected from GaAs or AlAs, and a second semiconductor device made of Ge.

18. The optoelectronic switch according to claim 1 or 2 wherein said optical-to-electrical converting means is constituted by a photodiode comprising a first semiconductor having a p-n junction and made of Si, and a second semiconductor made of a semiconductor selected from the group consisting of $In_{1-x}Ga_xAs_yP_{1-y}$, $Al_{1-x}Ga_xAs_ySb_{1-y}$, $In_{1-x}Ga_xAs_ySb_{1-y}$, and $(Al_xGa_{1-x})_yIn_{1-y}Sb$ having a lattice constant substantially coinciding with that of said first semiconductor and an energy band gap narrower than that of said first semiconductor.

19. The optoelectronic switch according to claim 1 or 2 wherein said optical-to-electrical converting means comprises a photodiode having an avalanche multiplication function.

20. The optoelectronic switch according to claim 1 or 2 wherein a continuously variable bias voltage supply means is used to apply a reverse bias voltage to said optical-to-electrical converting means.

* * * * *